United States Patent [19]
Takagi

[11] Patent Number: 5,017,512
[45] Date of Patent: May 21, 1991

[54] WAFER HAVING A DICING AREA HAVING A STEP REGION COVERED WITH A CONDUCTIVE LAYER AND METHOD OF MANUFACTURING THE SAME

[75] Inventor: Hiroshi Takagi, Hyogo, Japan
[73] Assignee: Mitsubishi Denki Kabushiki Kaisha, Tokyo, Japan
[21] Appl. No.: 568,930
[22] Filed: Aug. 17, 1990

Related U.S. Application Data

[62] Division of Ser. No. 385,879, Jul. 27, 1989.

[51] Int. Cl.5 ......................................... H01L 21/304
[52] U.S. Cl. .................................... 437/227; 437/226
[58] Field of Search ......................................... 437/226

[56] References Cited

U.S. PATENT DOCUMENTS

| 2,970,730 | 2/1961 | Schwarz | 437/226 |
| 3,040,489 | 6/1962 | DaCosta | 437/226 |
| 4,259,682 | 3/1981 | Gamo | 437/226 |
| 4,304,043 | 12/1981 | Gamo et al. | 437/226 |
| 4,729,971 | 3/1988 | Coleman | 437/226 |

FOREIGN PATENT DOCUMENTS

| 251052 | 11/1986 | Japan | 437/226 |
| 63-100837 | 12/1986 | Japan . | |

Primary Examiner—Olik Chaudhuri
Assistant Examiner—Long Pham
Attorney, Agent, or Firm—Lowe, Price, LeBlanc, Becker & Shur

[57] ABSTRACT

A conductive layer is formed at the step portion in a dicing line formed vertically and horizontally on a wafer and at a step portion of the region on which a test element for processing control formed inside of the dicing line or an alignment mark are formed, so as to completely cover the step portions. Since the conductive layer does not come off the step portions in subsequent steps, a short circuit of a wiring layer formed on a semiconductor chip region is prevented.

7 Claims, 12 Drawing Sheets

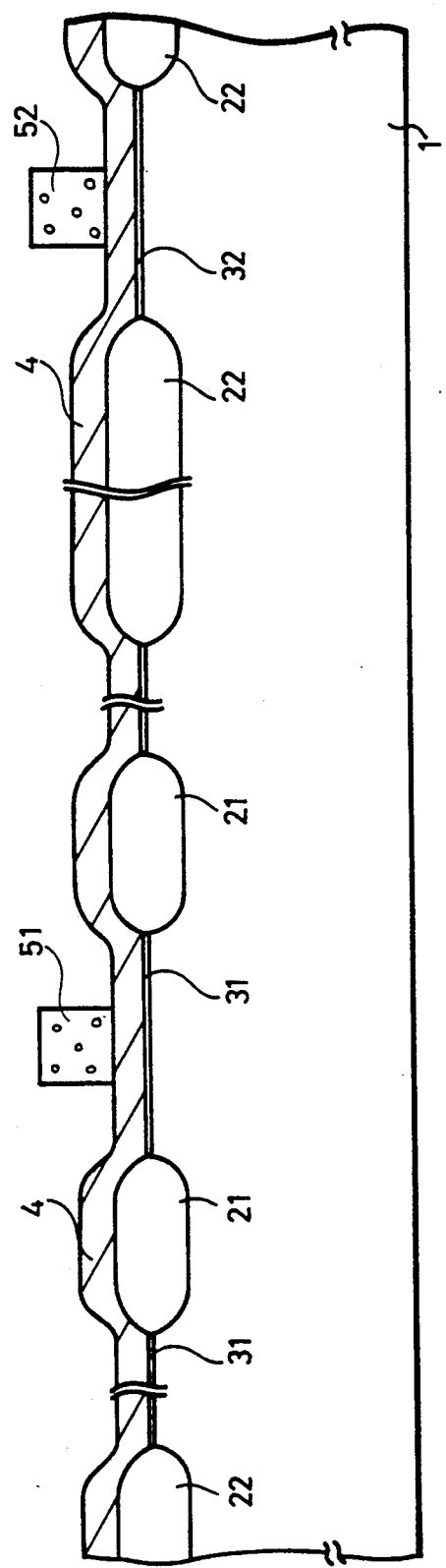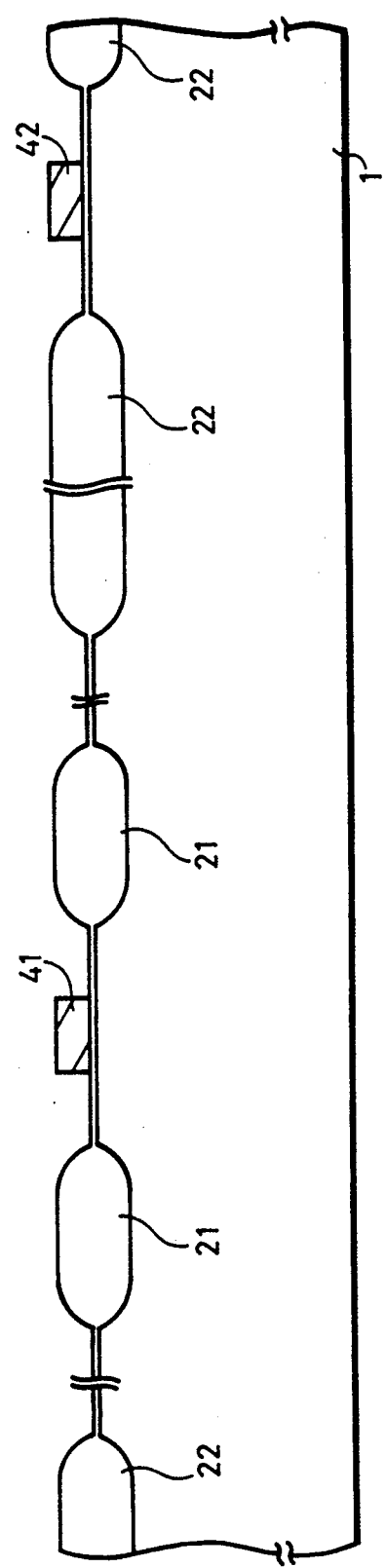

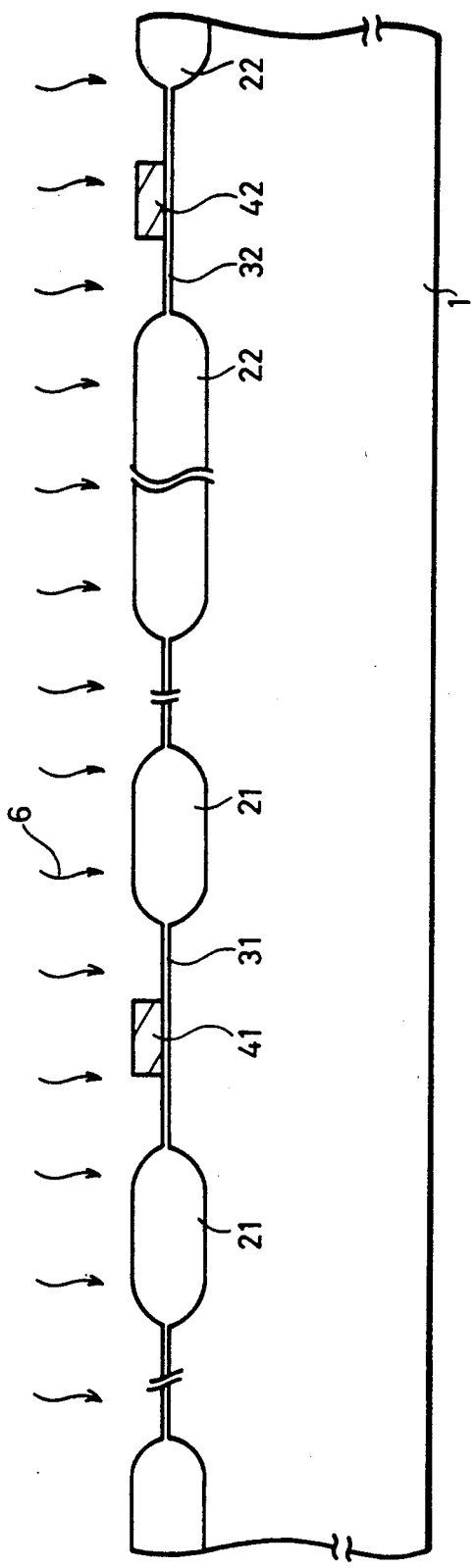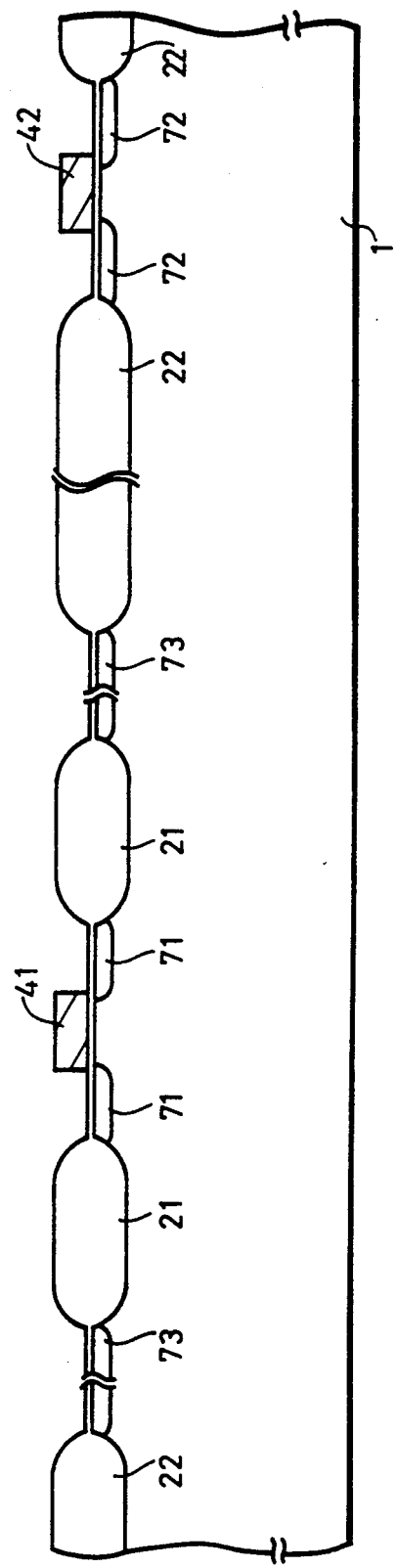

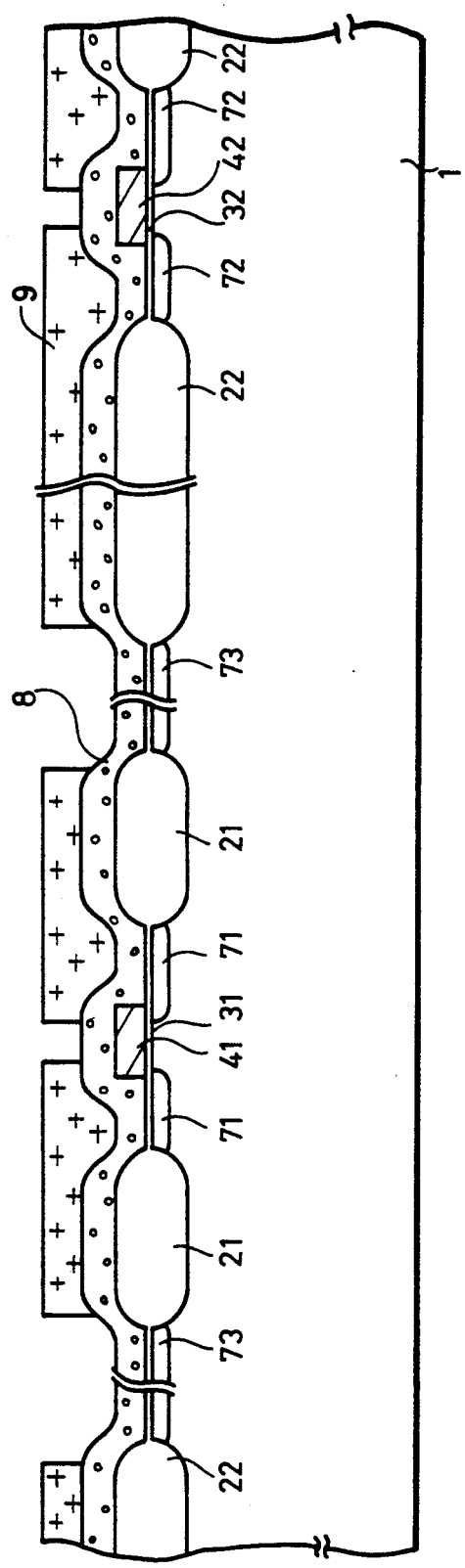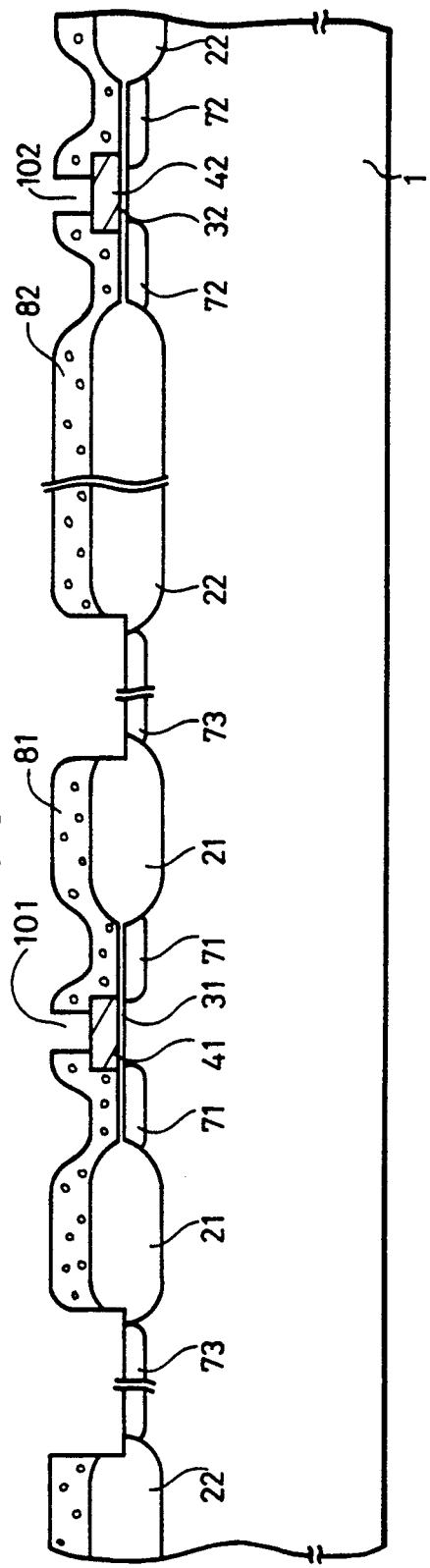

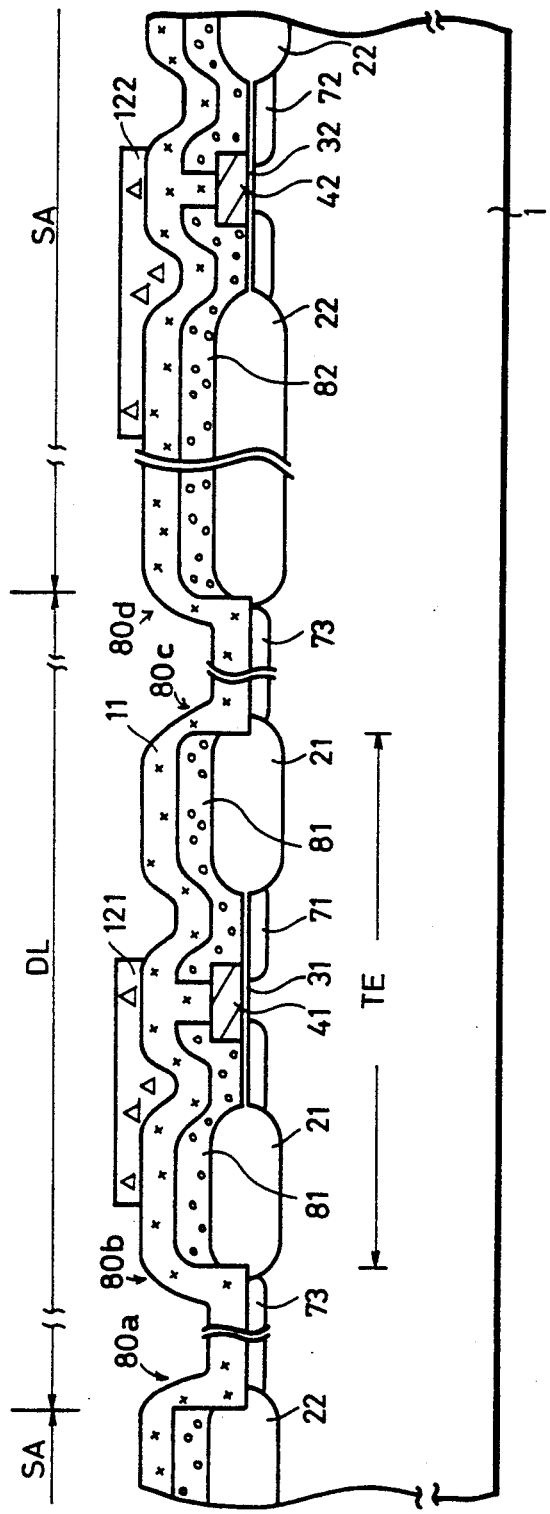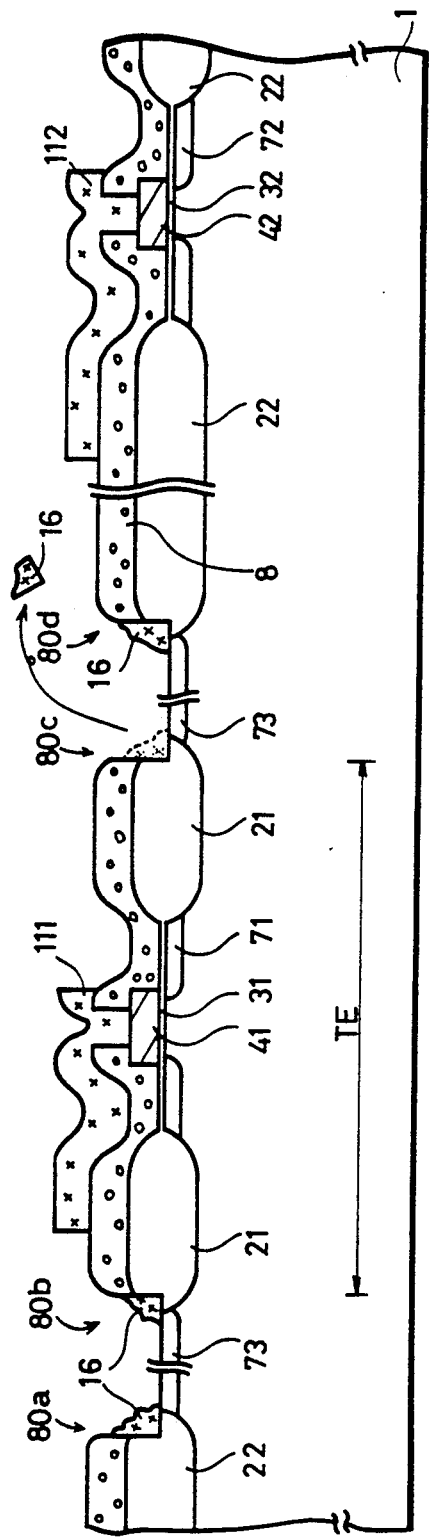

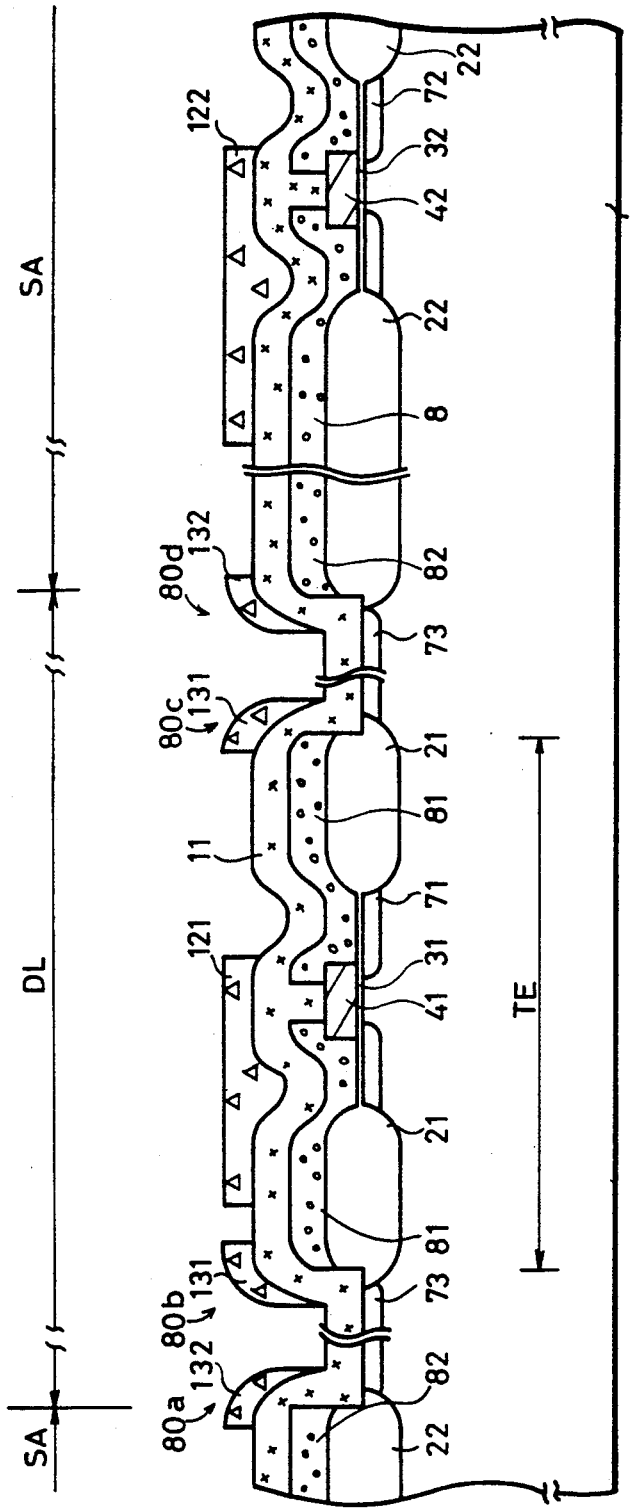
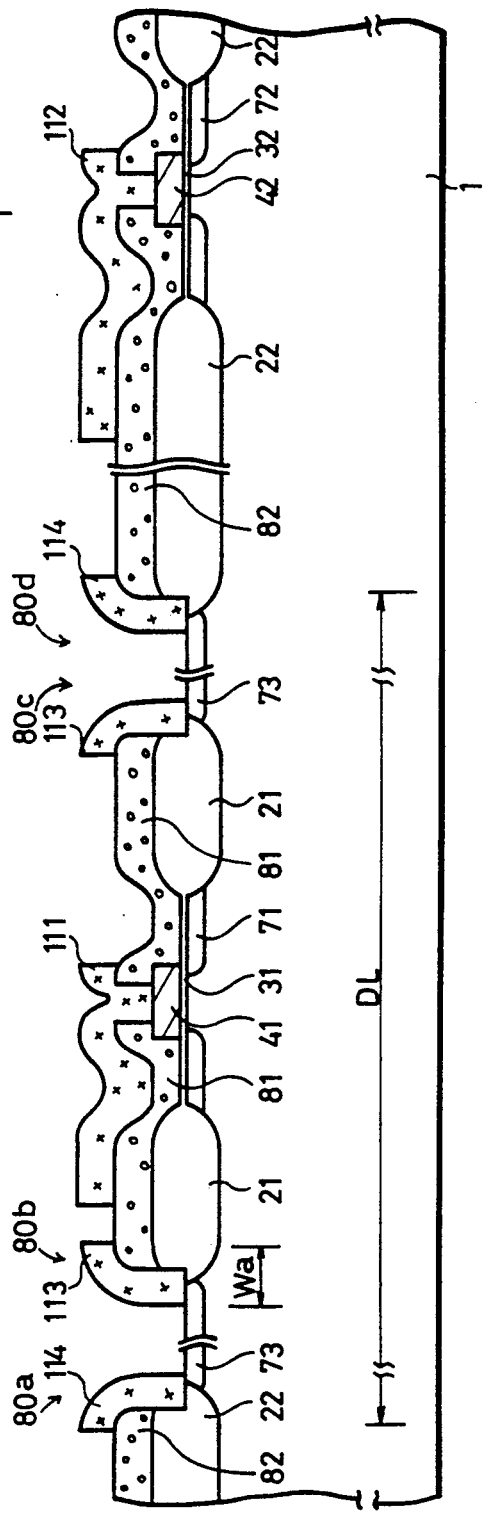
FIG.4A
FIG.4B

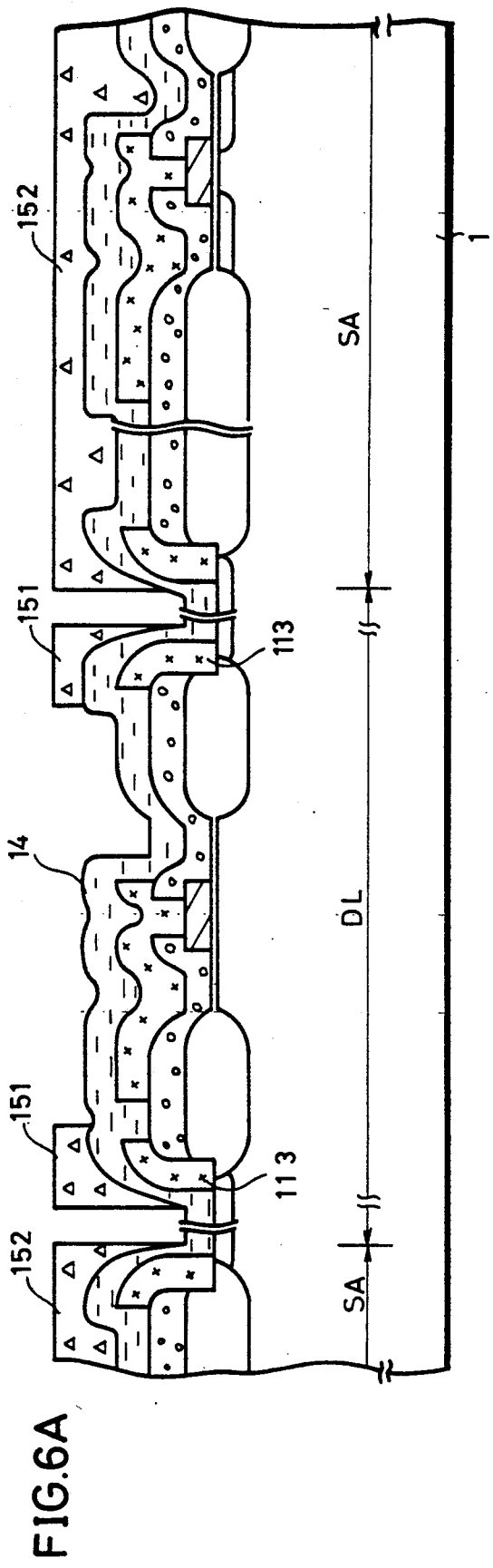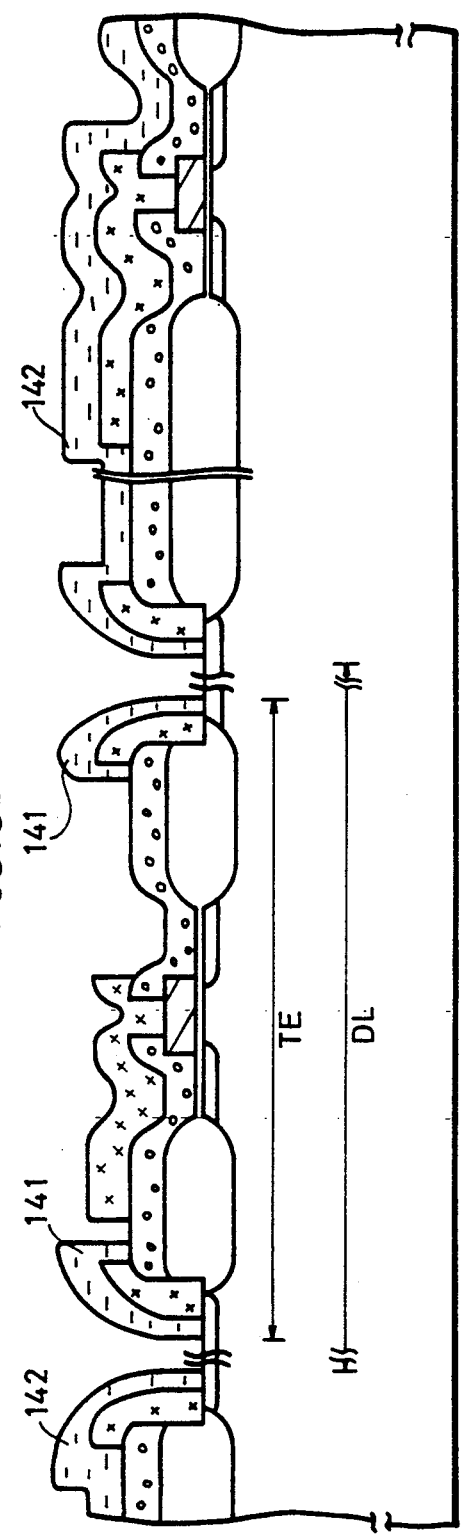
FIG.6A
FIG.6B

WAFER HAVING A DICING AREA HAVING A STEP REGION COVERED WITH A CONDUCTIVE LAYER AND METHOD OF MANUFACTURING THE SAME

This application is a division of application Ser. No. 07/385,879 filed July 27, 1989.

BACKGROUND OF THE INVENTION

1. Field of the Invention

The present invention generally relates to a wafer and, more particularly, a wafer having a dicing area and a step region covered with a conductive layer. The present invention also relates to a method of manufacturing therefor.

2. Description of the Background Art

A number of devices or IC chips are formed through wafer processes comprising a pattern forming step comprising thin film formation, pattern exposure and etching, and an impurities forming step comprising ion implantation and heat diffusion and the like. The devices or IC chips are isolated to form individual pellets by a step called dicing. A region for the isolation is called a dicing line or a dicing area. FIG. 1 shows the wafer on which the dicing lines are formed. Referring to FIG. 1, dicing lines DL are formed spaced apart in two directions crossing at right angles on a wafer 1. FIG. 2 is a enlarged sectional view of a region II shown in FIG. 1. Generally, a width W of the dicing areas DL is 50–100 $\mu$m and a depth D is 3–10 $\mu$m. Since the dicing area DL is a region cut by a metal rotary blade, an element as an IC (hereinafter referred to as a function element) is not formed in this region, but a test element 30 for testing the function element or an alignment mark 40 for mask alignment is formed.

The test element 30 is formed in the dicing area DL at the same time the function element 20 is formed in a region SA serving as a semiconductor chip. The test element 30 is the same as the function element 20 and it is used to check whether the function element 20 functions normally or not. The test element 30 and the function element 20 are, for example, MOS transistors. An interlayer insulating film 50 is formed on the test element 30. An electrode pad 70 electrically connected to the test element 30 through a wiring layer 60 is formed on the interlayer insulating film 50. It is possible to test the test element 30 by connecting a contact of a tester (not shown) to this electrode pad 70. A MOS semiconductor device having a MOS transistor as an element of a circuit and a check transistor for checking the characteristics of this MOS transistor, which are formed on the same substrate thereof is, for example, disclosed in Japanese Utility Model Laying Open No. 63-100837.

Referring to FIGS. 3A to 3J, a description is given of processes of forming a test element of the background of the present invention. FIGS. 3A to 3J are sectional views taken along a line III—III shown in FIG. 2.

Referring to FIG. 3A, first, isolation oxide films 21 and 22 for electrically isolating elements are formed in semiconductor chip regions SA and test element forming regions TE in dicing areas DL. The isolation oxide film 21 provided in the dicing area DL serves for a test element, and the isolation oxide film 22 provided in the semiconductor chip region SA serves for a function element.

Referring to FIG. 3B, a thin silicon oxide film 31 and 32 used as a gate oxide film is formed on the exposed surface of a semiconductor substrate 1.

Referring to FIG. 3C, a polycrystalline silicon film 4 is formed on the isolation oxide films 21 and 22 and the gate oxide films 31 and 32.

Then, a photoresist film of a positive type, for example, is formed on the polycrystalline silicon film 4. Then, the photoresist film is exposed to light through a mask. Then, by developing the photoresist film, photoresist patterns 51 and 52 shown in FIG. 3C can be obtained. The photoresist patterns 51 and 52 are formed in regions in which gate electrodes are to be formed. Then, a gate electrode 41 for the test element and a gate electrode 42 for the function element shown in FIG. 3D are obtained by etching the polycrystalline silicon film 4, using the photoresist patterns 51 and 52 as a mask.

Referring to FIG. 3E, impurity ions 6 are implanted by an ion implantation method, using the gate electrodes 41 and 42 and the isolation oxide films 21 and 22 as a mask. As a result, impurity diffusion layers 71, 72 and 73 are formed as shown in FIG. 3F. The impurity diffusion layer 71 is a source/drain of the test element, and the impurity diffusion layer 72 is a source/drain of the function element.

Referring to FIG. 3G, an interlayer insulating film 8 is formed on the whole surface of the semiconductor substrate 1. Then, a photoresist film of a positive type, for example, is formed on the interlayer insulating film 8. The photoresist film is exposed to light through a predetermined mask and then developed. As a result, a photoresist pattern 9 is obtained, which extends from the end portions of the gate electrodes 41 and 42 to the isolation oxide films 21 and 22, as shown in FIG. 3G. Then, as shown in FIG. 3H, an interlayer insulating film 81 for the test element and the interlayer insulating film 82 for the function element are obtained by etching the interlayer insulating film 8, using the photoresist pattern 9 as a mask. Contact regions 101 and 102 are formed in the gate electrodes 41 and 42, respectively, in the above described steps.

Then, referring to FIG. 3I, an Al layer 11 is formed by sputtering on the whole major surface of the semiconductor substrate 1 on which the interlayer insulating films 81 and 82 were formed.

Then, a photoresist layer of a positive type, for example, is formed on the Al layer 11. Then, the photoresist layer is exposed to light through a mask. Next, the photoresist layer is developed, whereby an unnecessary portion is removed. As a result, resist patterns 121 and 122 shown in FIG. 3I are formed. The resist patterns 121 and 122 are formed in wiring layer forming regions. Then, anisotropic etching is performed on the Al layer 11 using the photoresist layers 121 and 122 as a mask. As a result of the anisotropic etching, the Al layer 11 is removed except for the portion covered with the photoresist films 121 and 122. However, since the Al layer 11 is formed thick in step portions 80$a$, 80$b$, 80$c$ and 80$d$ in the dicing area DL in an etching direction, Al flakes 16 shown in FIG. 3J are not etched away and remain in the step portions 80$a$ to 80$d$. The step portions 80$a$ and 80$d$ are, here, border portions between the dicing areas DL and the semiconductor chip regions SA, and the step portions 80$b$ and 80$c$ are end portions of the test element forming region TE in the dicing area DL. Then, the photoresist layers 121 and 122 are removed and Al wiring layers 111 and 112 are obtained. Since the Al flakes 16 are not securely attached to the step portions 80a to 80d, the Al flakes 16 are prone to come off. If the Al flakes 16 come off to attach to the wiring layer 112 in the semiconductor chip region SA, there is caused a disadvantage that the Al wiring 112 and another wiring layer or the electrode pad short circuit in the semiconductor device. As a result, the yield and reliability in the production of the semiconductor device is reduced.

SUMMARY OF THE INVENTION

An object of the present invention is to provide a semiconductor device having high reliability with the high yield.

Another object of the present invention is to provide a wafer formed such that a conductive layer existing in a step portion of a dicing area may not come off.

A further object of the present invention is to provide a method of manufacturing a wafer formed such that a conductive layer existing in a step portion of a dicing area may not come off.

According to the present invention, the above-described objects can be attained by leaving a conductive layer existing in the step portion in the dicing area without etching.

According to a particular aspect of the present invention, a conductive layer is formed extending from one chip region through the dicing area to an opposite chip region, forming a resist layer so as to cover the portion on the step region between the chip region and the dicing area, etching the conductive layer using the resist film as a mask and leaving the conductive layer on the step region.

The wafer is divided into chips by cutting the dicing area having the conductive layer. However, direct cutting of the conductive layer is liable to wear a blade.

According to another aspect of the invention, wearing of the blade is reduced by coating the conductive layer with nitride, so that the blade cuts first the nitride layer.

According to the present invention, since a soft conducting material which accelerates wearing of the blade is not attached to the blade, the life of the blade for cutting the dicing area of the semiconductor device becomes longer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3J are views for describing test element forming processes which are a background art of the present invention;

FIGS. 4A and 4B are views for describing test element forming processes in accordance with one embodiment of the present invention;

FIGS. 6A to 6B are views showing a further preferred embodiment of the present invention;

DESCRIPTION OF THE PREFERRED EMBODIMENTS

Figure 1:
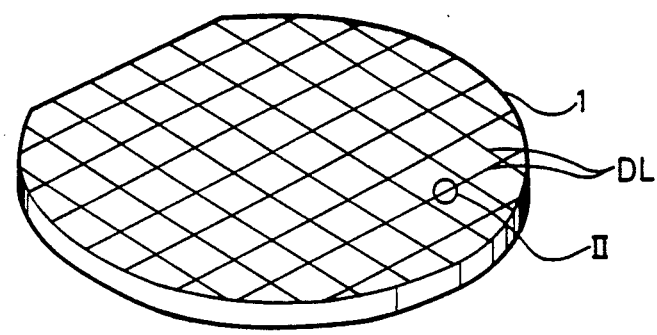
FIG. 1 is a perspective view showing a wafer on which dicing lines are formed.
Figure 2:
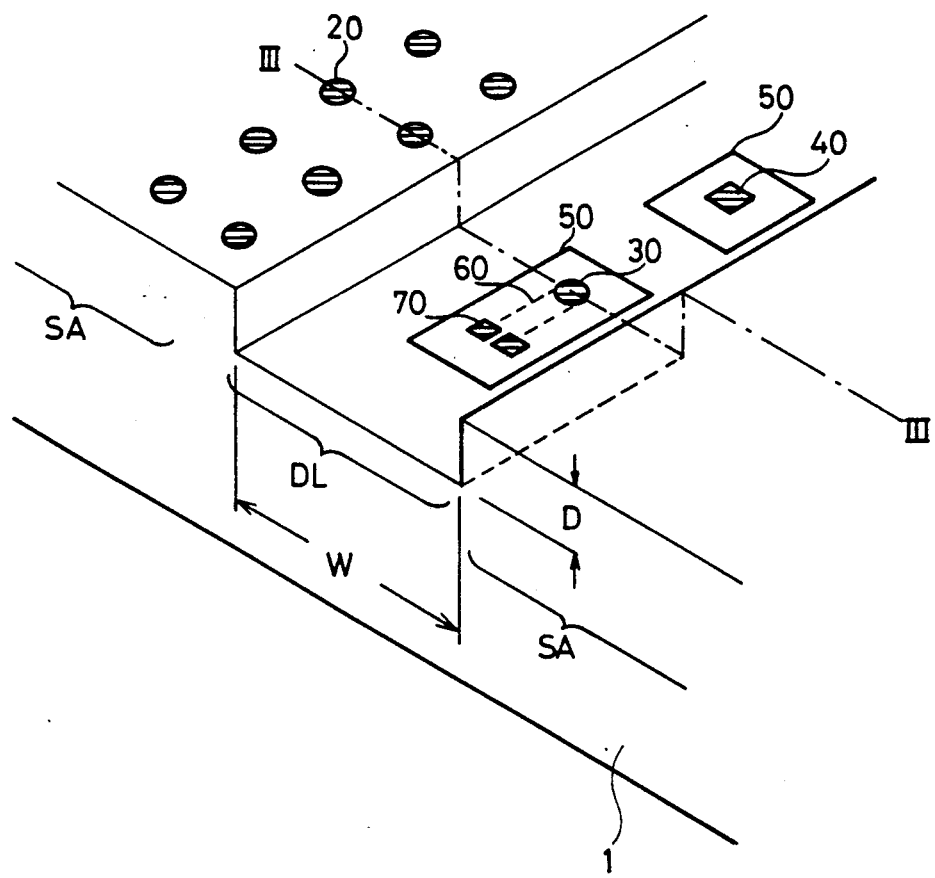
FIG. 2 is an enlarged sectional view of a region II shown in FIG. 1.
Figure 3A:
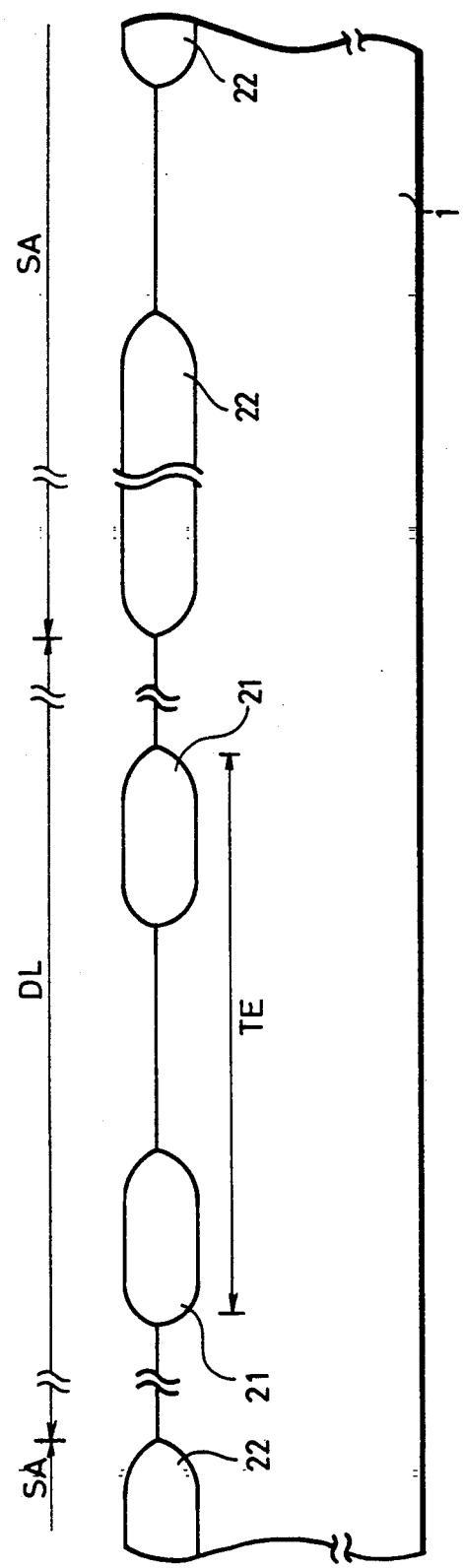
Figure 3B:
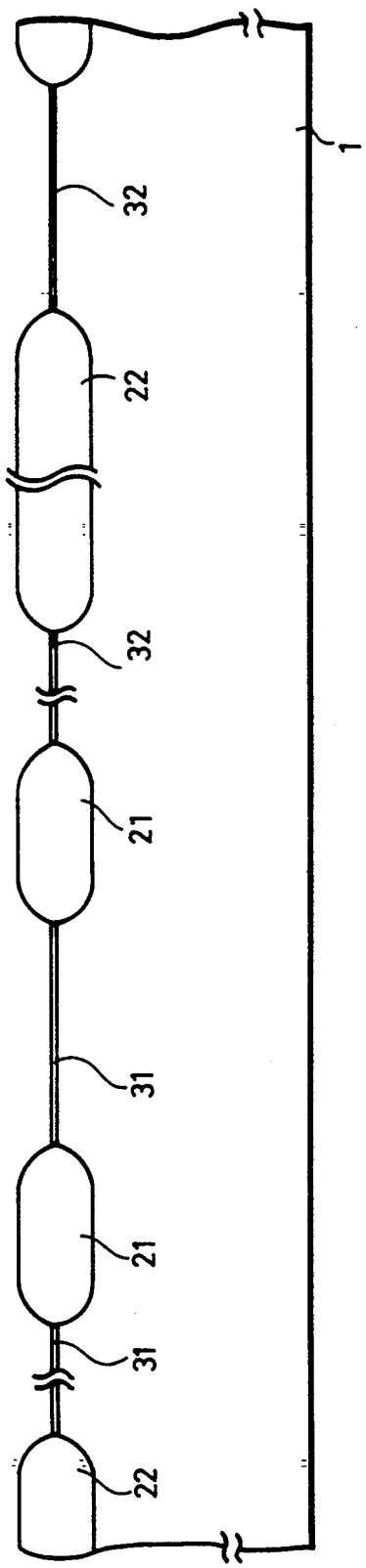

Test element forming processes in accordance with one embodiment of the present invention will hereinafter be described. The test element forming processes have the same steps as in the described background art up to the step of forming an Al layer 11 on the whole surface of a semiconductor substrate 1 by sputtering, so that descriptions of steps corresponding to FIGS. 3A to 3H are not repeated.

FIG. 4A is a view corresponding to FIG. 3I. Referring to FIG. 4A, photoresist patterns are not only formed in a wiring layer forming region but also in step portions 80a to 80d. Reference numbers 121 and 122 denote the photoresist patterns formed in the wiring layer forming region, and 131 and 132 denote the photoresist patterns formed in the step portions 80a to 80d. The step portions 80a and 80d are border portions between dicing areas DL and semiconductor chip regions SA, and the step portions 80b and 80c are end portions of a test element forming region TE each of in the dicing areas DL. The photoresist films 131 and 132 on the step regions are disposed such that edge portions of interlayer insulating films 81 and 82 may be placed between the side portions of the resist films spaced apart by 1–10 $\mu$m.

Then, anisotropic etching is performed on the Al film 11 using the photoresist films 121, 122, 131 and 132 as a mask to selectively remove the Al film 11. Since the step portions thick in an etching direction are not to be etched away, flakes of the Al film shown in FIG. 3J are not left when the etching is completed.

Referring to FIG. 4B, the photoresist films 121, 122, 131 and 132 are removed. As a result, Al frames 113 and 114 covering the step portions at the edge portions of the interlayer insulating films 81 and 82 are obtained other than Al wiring patterns 111 and 112. In this manner, the Al frames 113 and 114 are reliably formed by etching treatment using the photoresist films as a mask, and a width Wa is 2–20 $\mu$m. The Al frames 113 and 114 do not come off because the Al frames are attached to the step portions 80a to 80d over large areas that extend around the sides to the top surfaces of the interlayer insulating films. Therefore, the defect of the semiconductor device caused by a short circuit between the Al wirings can be prevented.

If the dicing area DL is cut at the same state as shown in FIG. 4B, the Al frames are scattered by a rotary blade in dicing, thereby causing the following problem.

Figure 5:
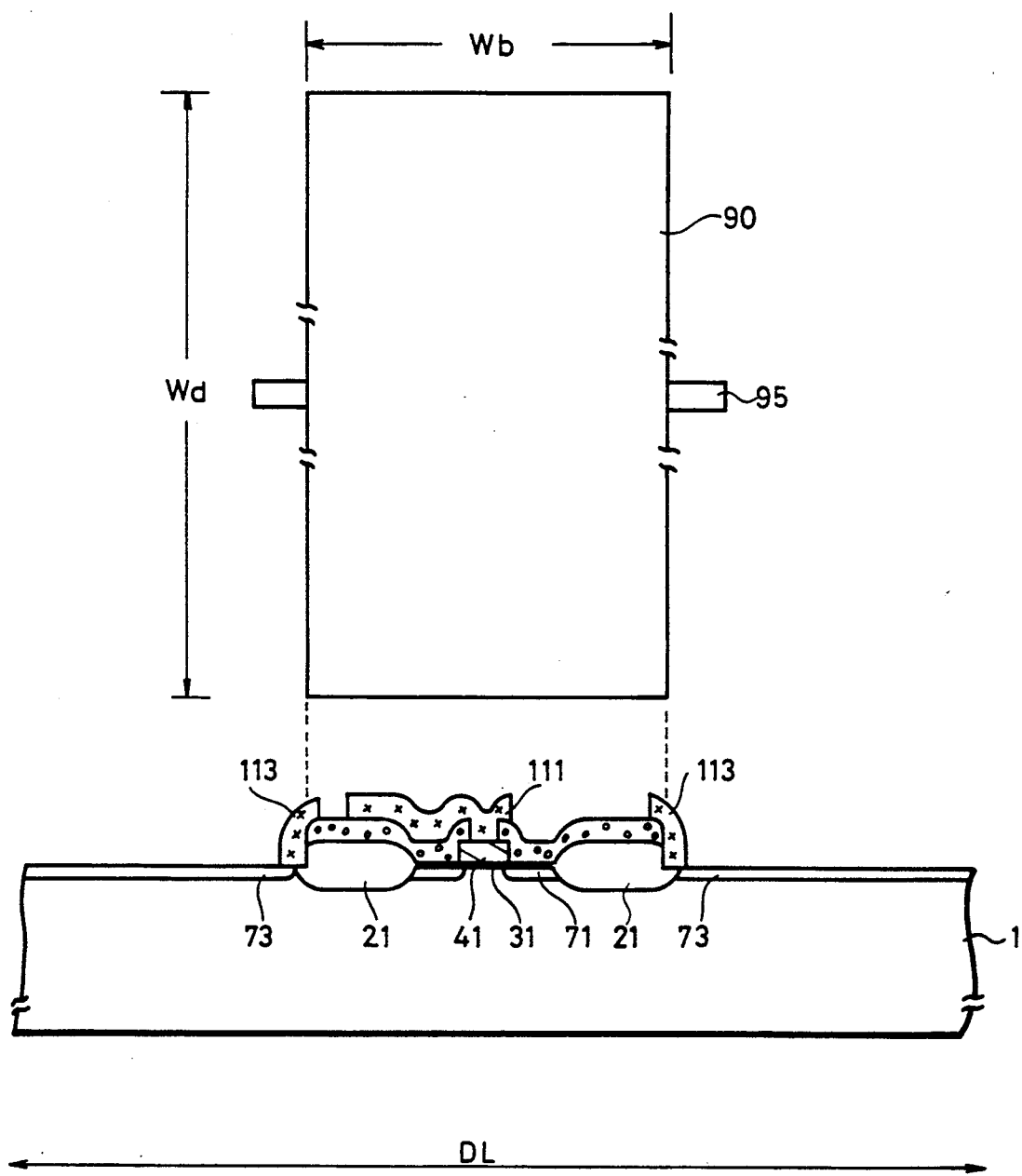
FIG. 5 is a view showing a positional relation between a rotary blade and a dicing area.

FIG. 5 shows a positional relation between the wafer and the rotary blade in dicing with a metal rotary blade. Referring to FIG. 5, a rotary blade 90 rotates around an axis 95. The rotary blade 90 has a Ni-alloy base embedded with many diamonds of 4–6 $\mu$m, and has a width Wb of 30 $\mu$m and a diameter Wd of 50–60 mm. When the dicing area DL is diced by the rotary blade 90, the Al frames 113 are scattered. As a result, the Al sticking on the edge of the blade embedded with diamonds causes increased cutting resistance of the blade, and finally, the blade is destroyed. Next, a description is given of a further preferred embodiment of the present invention which solves these disadvantages. The steps shown in FIGS. 6A and 6B are performed after the steps in FIG. 4B. Referring to FIG. 6A, a nitride film 14 is formed on the whole surface by a plasma CVD method. The nitride film 14 is a passivation film for protecting the surface of the IC chip. Then, a photoresist film of a negative type, for example, is formed on the nitride film 14. Then, the photoresist film is exposed to light through a photomask. Then, the photoresist film is developed. As a result, the photoresist film other than the exposed region is removed and photoresist patterns 152 formed on the semiconductor chip region SA and resist patterns 151 for covering the Al frames are formed. The resist patterns 151 for covering the Al frames are preferably formed wider than the portions of the Al frames 113 by 2 μm or more on their edges in order to effectively cover them.

Referring to FIG. 6B, the nitride film 14 is selectively removed using the resist patterns 151 and 152 as a mask. As a result, the Al frames 113 are completely covered with the nitride film 141.

Since the Al frames 113 are covered with the hard nitride film, the Al does not stick onto the edge of the blade as described above when dicing by the rotary blade 90. Therefore, the life of the rotary blade can be prolonged.

Figure 7A:
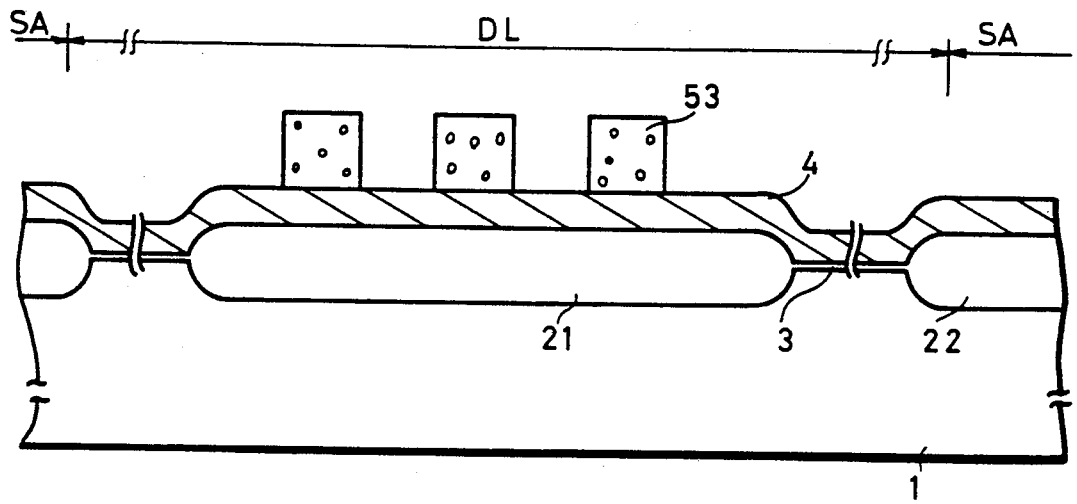
FIGS. 7A to 7F are views for describing alignment mark forming processes in accordance with another embodiment of the present invention.
Figure 7B:
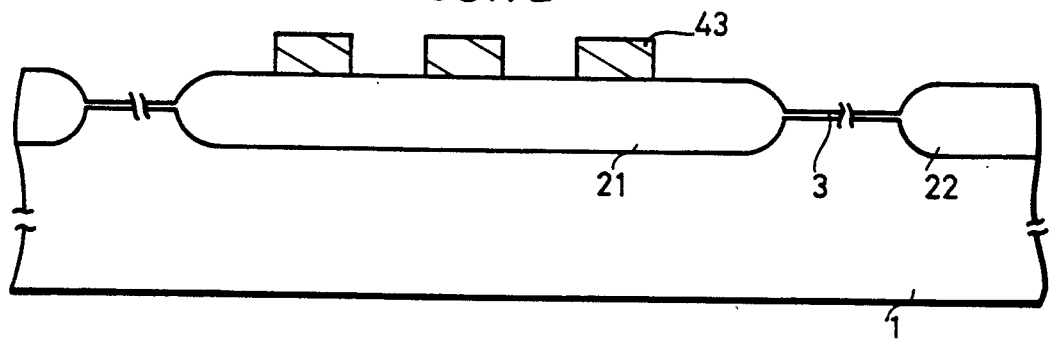

FIGS. 7A to 7F are cross sectional views for illustrating alignment mark forming processes in accordance with another embodiment of the present invention. Formation of an alignment mark is performed during the formation of the above described function element and test element. Referring to FIG. 7A, isolation oxide films 21 and 22 are formed in the dicing area DL and the semiconductor chip region SA. Then, a polycrystalline silicon film 4 is formed on the whole surface of the semiconductor substrate 1. A photoresist film is then formed and patterned to patterns 53 corresponding to a predetermined alignment mark. Then, the polycrystalline film 4 is etched away using the photoresist patterns 53 as a mask, so that alignment marks 43 are obtained as shown in FIG. 7B.

Figure 7C:
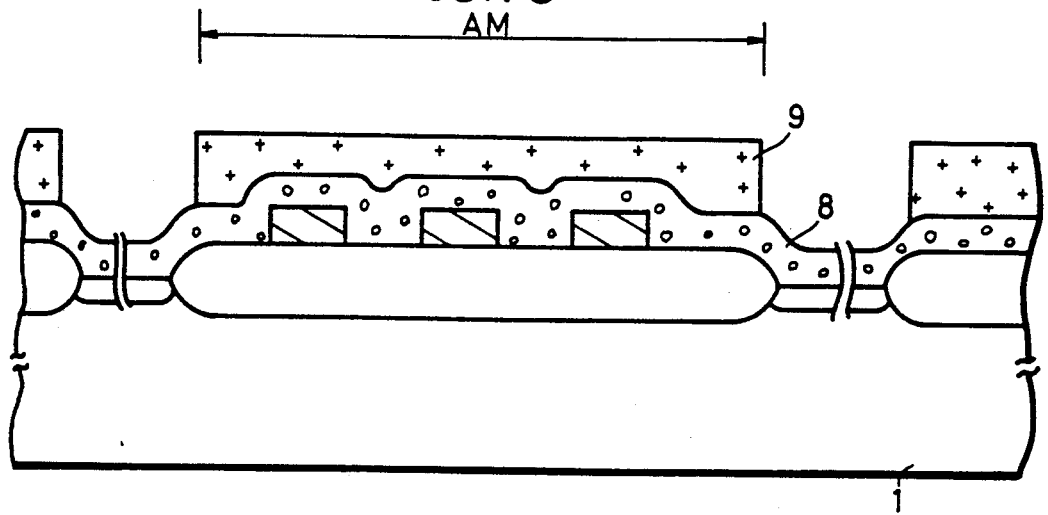
Figure 7D:
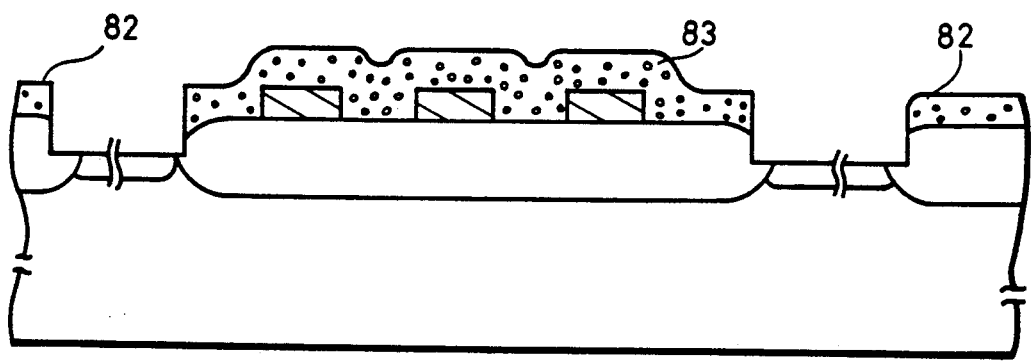

Referring to FIG. 7C, an interlayer insulating film 8 is formed on the whole surface of the semiconductor substrate 1. The photoresist film is then formed on the interlayer insulating film 8 and patterned to cover an alignment mark forming region AM, so that a photoresist pattern 9 is obtained. Then, the interlayer insulating film 8 is etched away using the photoresist pattern 9 as a mask, and thus interlayer insulating films 82 and 83 are obtained as shown in FIG. 7D.

Figure 7E:
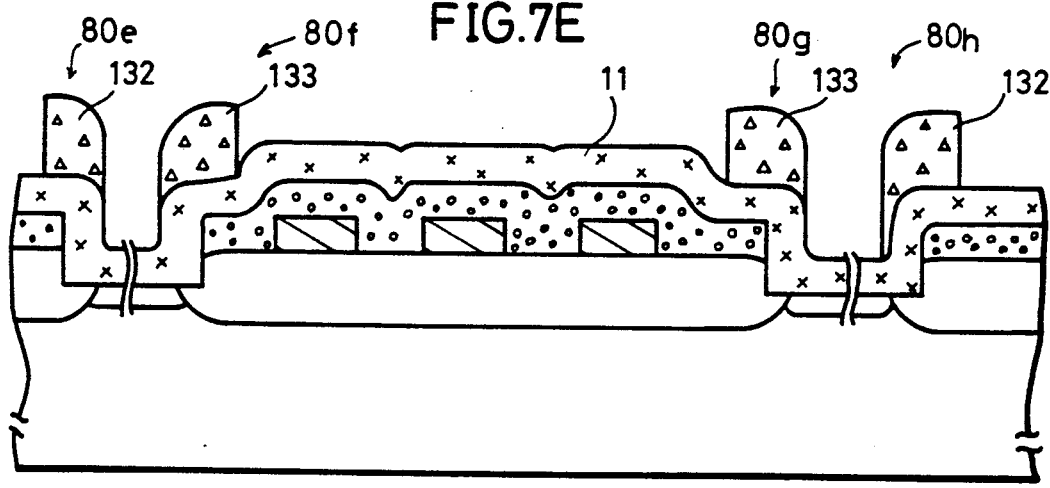
Figure 7F:
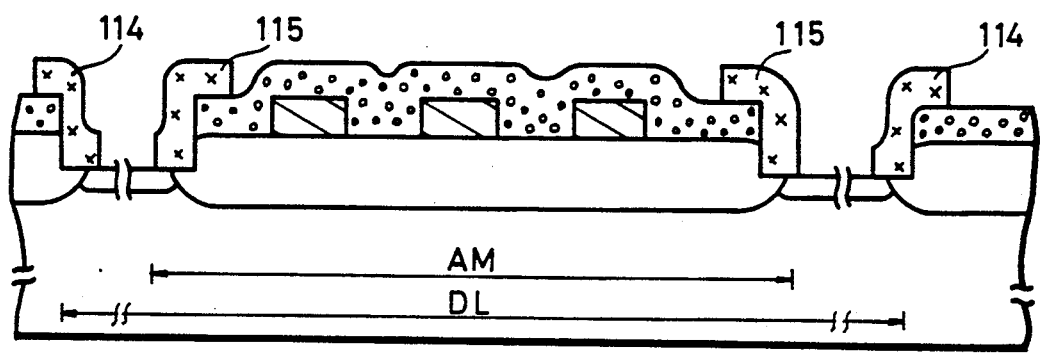

Referring to FIG. 7E, an AL layer 11 is formed on the whole surface of the semiconductor substrate 1. A photoresist layer is then formed on the Al layer 11. Then, portions of the photoresist layer other than step portions 80e, 80f, 80g and 80h are removed, thereby obtaining photoresist patterns 132 and 133. The Al layer 11 is then etched away using the photoresist patterns 132 and 133 as a mask. As a result, Al frames 114 and 115 are obtained as shown in FIG. 7F.

The Al frames 115 in the alignment mark forming region AM are covered with a nitride film in subsequent steps. Therefore, when the dicing area DL is cut, the Al frames 115 cause no obstacles in cutting of the rotary blade.

Figure 8:
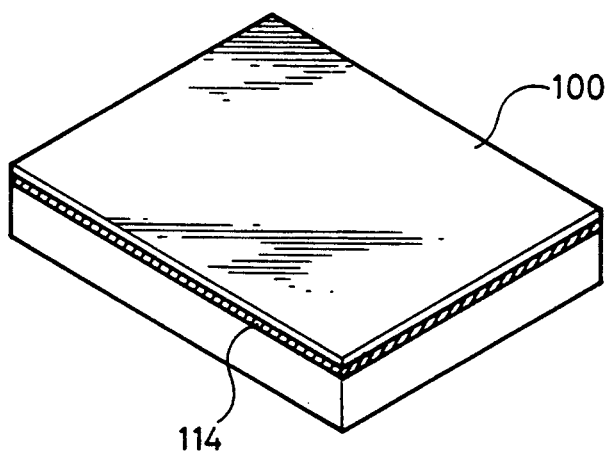
FIG. 8 is a perspective view showing a semiconductor device manufactured in accordance with one embodiment of the present invention.

FIG. 8 is a perspective view showing a semiconductor device formed through these dicing processes. The Al frame 114 attaches to the side surface of the semiconductor device 100.

Although a negative type was used as a photoresist in the above-described embodiment, a positive type may be used. In addition, although a description was given of a case where the Al wiring layer was formed in the above-described embodiment, the present invention may be also applied to a wiring layer other than Al.

As described above, since a conductive layer is reliably left at step portions of the dicing area and at the step portions existing in the dicing area so as to cover them, the conductive layer does not come off the step portions. As a result, it is possible to obtain a semiconductor device with the high reliability and yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of processing a wafer formed of a plurality of chip regions defining a dicing area for isolating said chip regions to form individual chips, wherein at least one step region is formed between said chip regions through said dicing area, said method comprising the steps of:
    forming a conductive layer extending from one chip region to an opposite chip region through said dicing area, said conductive layer overlying said at least one step region;
    covering said conductive layer on said at least one step region with a resist film;
    patterning said resist film; and
    using said resist film as a mask, etching said conductive layer so that only a portion thereof on said at least one step region remains, and subsequently dicing said wafer to form sand chips.

2. The method of claim 1, wherein said conductive layer is formed on a side wall and only a portion of the top surface of said step region.

3. The method of claim 1, further comprising a step of covering said step region in said conductive layer with an insulating film harder than the conductive layer.

4. A method of processing a wafer formed of a plurality of chip regions defining a dicing area for isolating said chip regions to form individual chips, wherein a first step region between each of said chip regions and said dicing area, and a second step region formed of the stacked films in said dicing area are formed, said method comprising the steps of:
    forming a conductive layer extending from one chip region to an opposite chip region through said dicing area and said stacked films, said conductive layer overlying said first step region and said second step region;
    covering said conductive layer on said first step region and said second step region with a resist film;
    patterning said resist film; and
    using said resist film as a mask, etching said conductive layer so that portions thereof on said first step region and said second step region remain, and subsequently dicing said wafer to form sand chips.

5. The method of claim 4, further comprising the step of covering said conductive layer on said first step region and said second step region with an insulating film harder than the conductive layer.

6. The method of claim 4, wherein a semiconductor element is formed in each of said chip regions, and each of said stacked films is a test element for testing said semiconductor element.

7. The method of claim 4, wherein each of said stacked films comprises an alignment mark for aligning a mask.

* * * * *